United States Patent [19]
Son et al.

[11] Patent Number: 5,978,259
[45] Date of Patent: Nov. 2, 1999

[54] SEMICONDUCTOR MEMORY DEVICE

[75] Inventors: Jeong-Hwan Son, Daejeon; Wouns Yang, Chungcheongbuk-do, both of Rep. of Korea

[73] Assignee: Semicon Co., Ltd., Chungcheongbuk-do, Rep. of Korea

[21] Appl. No.: 09/057,604

[22] Filed: Apr. 9, 1998

[30]          Foreign Application Priority Data

Jul. 22, 1997 [KR] Rep. of Korea ..................... 97-34249

[51] Int. Cl.⁶ .................................................. G11C 13/00
[52] U.S. Cl. .......................................... 365/182; 365/175
[58] Field of Search ............................... 365/51, 63, 174, 365/175, 182, 185.1, 185.27; 437/45

[56]                  References Cited

U.S. PATENT DOCUMENTS 4,649,629  3/1987  Miller et al. ............................... 437/45
5,081,052  1/1992  Kobayashi et al. .

*Primary Examiner*—Terrell W. Fears

[57]               ABSTRACT

Provided is a semiconductor device, including: a semiconductor substrate; a first conductive type well which is formed on the semiconductor substrate; first and second field oxide layers which are formed on the well, defining the active region of the device; a node junction, where second conductive type impurity ions are heavily doped, making contact with the field oxide layer in the well; a gate electrode formed by interposing a gate oxide layer between the second field oxide layer and the node junction on the well; a switching device made from an interlevel insulating layer, for covering the gate electrode, and having a contact hole exposing the node junction on the semiconductor substrate; a storage electrode which makes contact with the node junction through the contact hole; a dielectric layer formed on the storage electrode; and a memory device made of a plate electrode which is formed on the dielectric layer.

18 Claims, 2 Drawing Sheets

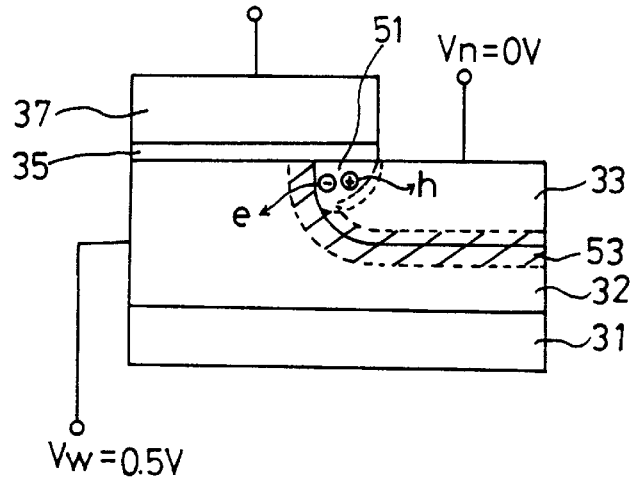
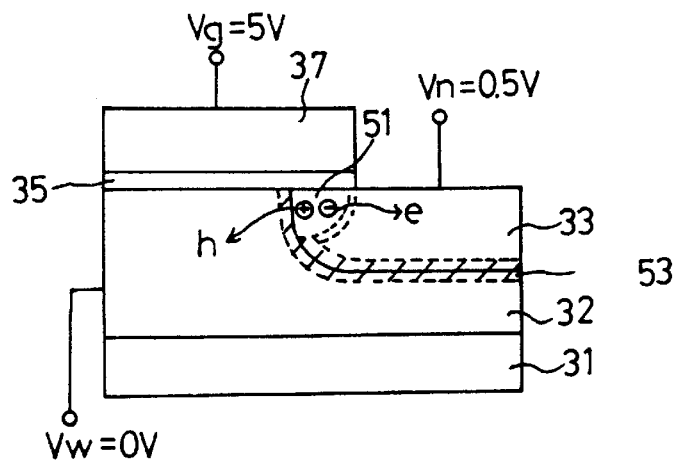
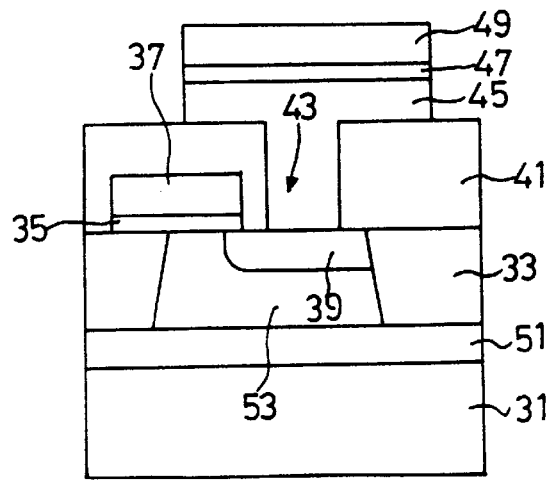

SEMICONDUCTOR MEMORY DEVICE

BACKGROUND OF THE INVENTION

1. Field of the Invention

The present invention relates to a semiconductor memory device containing a switching means and a storage means, specifically, a semiconductor memory device which can be reduced in size by constructing the switching means using a diode.

2. Discussion of Related Art

In general, the size of the unit cell of the semiconductor decreases with the increase of its integrity. So far decreasing the size of the unit cell has proceeded according to the development of manufacturing apparatus and techniques. As a result of recent development, present manufacturing processes are now producing devices with line widths below half $\mu$m.

FIG. 1 is a sectional view of a conventional semiconductor memory device.

The conventional semiconductor memory device has transistors serving as the switching means, and capacitor serving as storage devices. The transistor is constructed in a manner that a well 12, in which N type impurity ions are doped, and a field oxide layer 13 are formed on a semiconductor substrate 11. The field oxide layer 13 is made by local oxidation of silicon (LOCOS) or shallow trench isolation (STI). P type impurity ions are heavily doped on the active regions of a device, defined by the field oxide layer 13 and well 12, to form the bit line junction 19 and the node junction 20, serving as the source and the drain respectively. The bit line junction 19 is electrically connected to the bit line (not shown) while the node junction 20 is connected to the capacitor. Gate electrode 17 is constructed to serve as a word line by interposing gate insulating layer 15 between the bit line junction 19 and the node junction 20 on well 12. The gate insulating layer 15 is made of an oxide of silicon by the thermal oxidation, and the gate electrode 17 is made of polycrystal silicon or polycide in which impurity ions are doped. An interlevel insulating layer 21 is formed on the thus-structured transistor.

The capacitor has a storage electrode 25, constructed to make contact with node junction 20 through contact hole 23 in patterning the interlevel insulating layer 21; a dielectric layer 27, formed on the storage electrode 25; and a plate electrode 29, formed on the surface of dielectric layer 27. Storage electrode 25 fills contact hole 23, and thus makes contact with the node junction 20. storage electrode 25 and plate electrode 29 are made of polysilicon or metal in which impurity ions are doped. Dielectric layer 27 is a thin layer made of heavily dielectric materials such as silicon oxide, silicon nitride/silicon oxide, PZT(Pb(Zr Ti)O$_3$), BST(Ba(Sn Ti)O$_3$), or Ta$_2$O$_5$, thereby storing electric charges.

The thus-structured semiconductor memory device has a channel for electrically connecting bit line junction 19 to node junction 20, on the well under the gate electrode 17, and is activated by applying a negative turn-on voltage to gate electrode 17. Therefore, when an electric charge is applied to the bit line, the electric charge accumulates on the dielectric layer 27 of the capacitor through bit line junction 19, channel, and node junction part 20. The electric charges that accumulate on the dielectric layer 27 are stored in the gate storage 17 for a predetermined time with cutting off of the turn-on voltage. In addition, when applying a negative turn-on voltage to gate electrode 17 and the negative voltage to the bit line in the state that the electric charges are accumulated, the electric charge of the dielectric layer 45 in the capacitor flow across the node junction part 20, channel and the bit line junction part 29 to the bit line.

But, the above-mentioned conventional semiconductor memory device has a problem when a transistor is used for the switching device, that this limits the ability to decrease the size of the cell because the node and bit line junctions must be formed on either side of the gate electrode. In addition, as the gate electrode is shortened to increase its integrity, the manufacturing processes become more difficult.

SUMMARY OF THE INVENTION

Accordingly, the present invention is directed to a semiconductor memory device that substantially obviates one or more of the problems, limitations, and disadvantages of the related art.

An object of the present invention is to produce a semiconductor memory device which enhances the integrity of the device by decreasing the size of the cell.

Another object of the invention is to produce a semiconductor memory device which facilitates the manufacturing processes by making the gate electrode long.

Additional features and advantages of the invention will be set forth in the description which follows, and in part will be apparent from the description, or may be learned by practice of the invention. The objects and other advantages of the invention will be realized and attained by using the structure particularly as pointed out in the written description and claims hereof, as well as the appended drawings.

To achieve these and other advantages and in accordance with the purpose of the present invention, as embodied and broadly described, a semiconductor device includes: a semiconductor substrate; a first conductive type well which is formed on the semiconductor substrate; first and second field oxide layers which are formed on the well, defining the active region of the device; a node junction, where second conductive type impurity ions are heavily doped, making contact with the field oxide layer in the well; a gate electrode formed by interposing a gate oxide layer between the second field oxide layer and the node junction on the well; a switching device made from an interlevel insulating layer, for covering the gate electrode, and having a contact hole exposing the node junction on the semiconductor substrate; a storage electrode which makes contact with the node junction through the contact hole; a dielectric layer formed on the storage electrode; and a memory device made of a plate electrode which is formed on the dielectric layer.

It is to be understood that both the foregoing general description and the following detailed description are exemplary and explanatory, and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention that together with the description serve to explain the principles of the invention.

Figure 1:
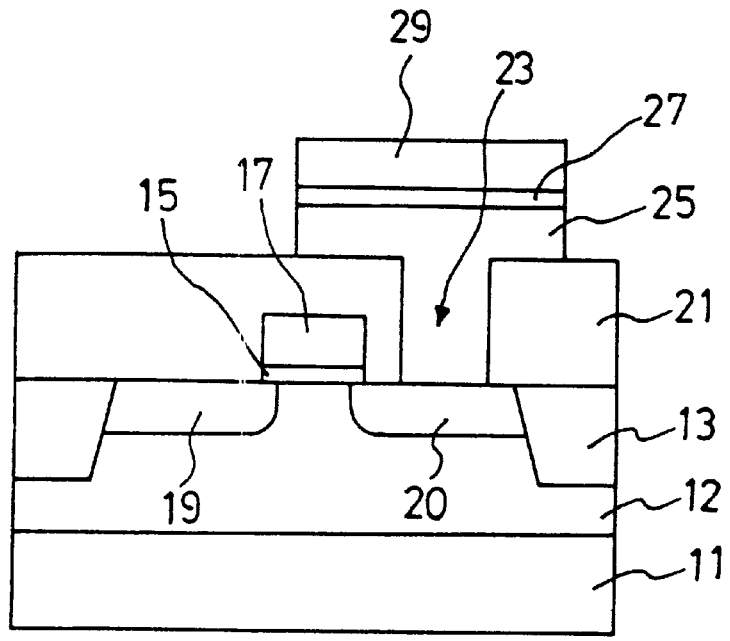
FIG. 1 is a sectional view of a conventional semiconductor memory device.
Figure 2:
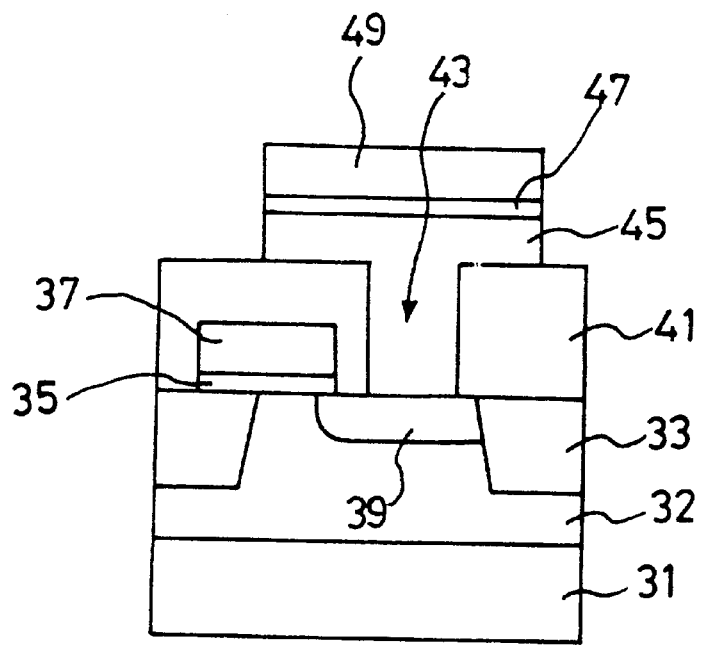
FIG. 2 is a sectional view of a semiconductor memory device according to an embodiment of the invention.

FIGS. 3A and 3B schematically illustrate the operational state of the semiconductor memory device of FIG. 2; and FIG. 4 is a sectional view of the semiconductor memory device according to another embodiment of the invention.

DETAILED DESCRIPTION OF PREFERRED EMBODIMENT

Reference will now be made in detail to the preferred embodiments of the present invention, examples of which are illustrated in the accompanying drawings.

As illustrated in FIG. 2, a semiconductor memory device, according to an embodiment of the invention, has a gate diode, for controlling the junction current through a gate by overlapping the gate on the pn junction used as a switching device, and a capacitor used as a storage device.

The gate diode is structured in a manner where a well 32, in which N type impurity ions are doped, and a field oxide layer 33, for defining the active region of the device, are formed on a semiconductor substrate 31. In this case, a P type semiconductor substrate 31 is used, and N type semiconductor substrate can be employed therefor. In case where an N type semiconductor substrate 31 is used, an area where P type impurity ions are doped may be formed to surround the well 32 in order to electrically separate the semiconductor substrate 31 and the well 32. The well 32 is used for a bit line, and a field oxide layer 33 is created using either the LOCOS or STI method. The concentration of the impurity ions in the well 32 is increased to decrease the resistance in the bit line. A node junction 39 is formed where the heavily doped P type impurity ions come into contact with the field oxide layer 33 formed on one side of the well 32.

A gate insulating layer 35 separates the field oxide layer 33, formed on the other side of the well 32 and the node junction 39, so that the gate electrode 37, used for a word line, overlaps with the field oxide layer 33 and the node junction 39. The gate insulating layer 35 is made of oxides of silicon by thermal oxidization, and the gate electrode 37 is made of polycrystal silicon or polycide in which N type impurity ions are doped.

The gate diode used as the switching device decreases the size of the cell because the node junction 39 is formed on one side of the gate electrode 37 and the other side overlaps with the field oxide layer 33. Furthermore, as the gate electrode 37 overlaps with the field oxide layer 33, its length increases, making it easier to pattern. Also, the node junction 39 makes contact with the capacitor such that they are connected electrically to each other.

The capacitor contains a storage electrode 45, which makes contact with the node junction 39 through a contact hole 43 formed in interlevel insulating layer 41, a dielectric layer 47 formed on the storage electrode, and a plate electrode 49 formed on the surface of the dielectric layer 47. The storage electrode 45 fills the contact hole 43 and makes contact with node junction 39. The storage electrode 45 and the plate electrode 49 are made of polycrystal silicon or metal where impurity ions are doped. The dielectric layer 47 is made of dielectric materials such as silicon oxides or silicon nitride/silicon oxide, or other high-dielectric materials such as PZT(Pb(Zr Ti)O$_3$), BST(Ba(Sn Ti)O$_3$) or Ta$_2$O$_5$, thereby storing electric charges therein.

FIGS. 3A and 3B illustrate the operational states of the semiconductor memory device of FIG. 2.

As illustrated in FIG. 3A, when positive turn-on voltage, for example, a gate voltage Vg of 5V is applied to the gate electrode 37, a deep depletion layer 51 is formed on the area overlapping with the gate electrode 37 in the node junction 39, so that electrons become the minority carrier and holes become the majority carrier. The electrons and holes generated in the deep depletion area 51 flow to the well 32 and the node junction 39 respectively by the potential difference between the well 32, used for the bit line, and the node junction 39, and create a gate-induced drain leakage (GIDL) current.

In the state where the electrons and the holes are generated in the deep depletion area 51, forward bias voltage, for example a voltage being insufficient to turn on the junction between the well 32 and the node junction part 39, is applied between the well 32 and the node junction 39. That is, a well voltage Vw of 0.5 V is applied to the well 32 and a node voltage Vn of 0 V is applied to the node junction 39. Under these conditions, the depletion area 53 is formed in the junction of the well 32 and the node junction 39 so that the electrons, being the minority carrier generated in the deep depletion area 51, flow toward the well 32, and the holes, being the majority carrier, flow toward node junction 39. Therefore, the current flows from the well to the node junction 39 so that the holes are stored in the dielectric layer 47 through storage electrode 45 of the capacitor illustrated in FIG. 2. Thus the data are stored in the semiconductor memory device. If the turn-on voltage through the gate electrode 37 is cut off, the channel is turned off so that the holes stored in dielectric layer 47 of the capacitor are maintained for a predetermined period of time.

As illustrated in FIG. 3B, when the positive turn-on voltage, for example a gate voltage Vg of 5 V, is applied to the gate electrode, the electrons and holes are generated in the deep depletion area 51 overlapping with the gate 37 of the node junction part 39. In the state where the electrons and the holes are generated in the deep depletion area 51, a reverse bias voltage, for example a voltage which is insufficient to turn on the junction between the well 32 and the node junction 39, is applied between the well 32 and the node junction 39. That is, a well voltage Vw of 0 V is applied to the well 32 and the node voltage Vn of 0.5 V is applied to the node junction 39. As a result, the depletion area 53 is formed in the junction of the well 32 and the node junction part 39 where the electrons, being the minority carrier generated in the deep depletion area 51, flow toward the node junction part 39, and the holes, being the majority carrier, flow toward the well 32. Therefore, the current flows from the node junction 39 to the well 32 so that the holes, stored in the dielectric layer of the capacitor, shown in FIG. 2, flow through the storage electrode 47, node junction 39, and the well 32 to thereby read the data programmed in the semiconductor memory device.

As illustrated in FIG. 4, the semiconductor memory device according to another embodiment of the invention is the same as the above-mentioned embodiment of the invention, except that the switching device and the storage device are constructed on the SOI substrate(Silicon On Insulator). That is, the semiconductor device according to another embodiment of the invention is structured in a manner that a buried insulating layer 51 is formed on a semiconductor substrate, and a monocrystal silicon layer 53, where N type impurity ions are doped to produce a bit line on the buried insulating layer 51. In this case, the buried insulating layer 51 and the monocrystal silicon layer 53 and the SOI structure are formed using a separation by implanted oxygen (SIMOX) method or a bonded and etchback (BE) method.

When the buried insulating layer 51 and the monocrystal silicon layer 53 are formed using the SIMOX method, the semiconductor substrate 31 is P type which is the same conductive type as monocrystal silicon layer 53. In cases where they are formed using the BE method, the substrate 31 may be P type or N type, regardless of the monocrystal silicon layer 53.

Where the field oxide layer 33 makes contact with the buried insulating layer 51 defines the active region of the device, so that the monocrystal silicon layer 53, used for the bit line, completely insulates every unit cell.

Therefore, the semiconductor memory device according to the invention employs a gate diode as the switching device, the diode having one side on which the node junction is formed and the other side which overlaps with the field oxide layer, so that the invention has a decreased the cell size, enhancing integrity.

Furthermore, as the gate electrode overlaps with the field oxide layer, its length is enlarged making it easier to pattern. Consequently, the manufacturing processes are facilitated.

Moreover, as the buried insulating layer and the field oxide layer make contact with each other, the active region of the device is completely insulated from the adjacent active regions. Therefore, the monocrystal silicon layer used for the bit line is completely insulated in every unit cell.

It will be apparent to those skilled in the art that various modifications and variations can be made in the semiconductor memory device of the present invention without departing from the spirit or scope of the invention. Thus, it is intended that the present invention cover the modifications and variations of this invention provided they come within the scope of the appended claims and their equivalents.

What is claimed is:

1. A semiconductor device, comprising:
    a semiconductor substrate;
    a first conductive type well which is formed on the semiconductor substrate;
    first and second field oxide layers which are formed on the well, defining the active region of the device;
    a node junction, where second conductive type impurity ions are heavily doped, making contact with the field oxide layer in the well;
    a gate electrode formed by interposing a gate oxide layer between the second field oxide layer and the node junction on the well;
    a switching device made from an interlevel insulating layer, for covering the gate electrode, and having a contact hole exposing the node junction on the semiconductor substrate;
    a storage electrode which makes contact with the node junction through the contact hole;
    a dielectric layer formed on the storage electrode; and
    a memory device made of a plate electrode which is formed on the dielectric layer.

2. The device as claimed in claim 1, wherein the semiconductor substrate is either a first or a second conductive type.

3. The device as claimed in claim 2, further comprising an area where second conductive type impurity ions are doped around the well when the semiconductor substrate and the well are the first conductive type.

4. The device as claimed in claim 1, wherein the well is used as a bit line.

5. The device as claimed in claim 1, wherein the gate electrode is made of polycrystal silicon or polycide.

6. The device as claimed in claim 1, wherein the gate electrode overlaps with a portion of the node junction.

7. The device as claimed in claim 1, wherein a deep depletion layer is created on the portion which overlaps with the gate of the node junction when a turn-on voltage is applied to the gate in order to generate a majority carrier and a minority carrier.

8. The device as claimed in claim 7, wherein a forward bias voltage is applied between the well and the node junction, which is insufficient to turn on the junction, so that the majority carrier flows toward the well and the minority carrier flows toward the node junction.

9. The device as claimed in claim 7, wherein a reverse bias voltage is applied between the well and the node junction, which is insufficient to turn on the junction, so that the majority carrier flows toward the node junction part and the minority carrier flows to the well.

10. A semiconductor memory device, comprising:
    a first conductive type semiconductor substrate;
    a buried insulating layer formed on the semiconductor substrate;
    a first conductive type semiconductor layer formed on the buried insulating layer;
    first and second field oxide layers each making contact with the buried insulating layer on the semiconductor layer, defining the active region of the device;
    a node junction where second conductive type impurity ions are heavily doped where they make contact with the first field oxide layer in the semiconductor layer;
    a gate electrode formed by interposing a gate oxide layer between the second field oxide layer and the node junction on the semiconductor layer;
    a switching device made of an interlevel insulating layer that covers the gate electrode and exposes the node junction on the semiconductor substrate;
    a storage electrode formed such that it is in contact with the node junction through the contact hole;
    a dielectric layer which is formed on the storage electrode; and
    a plate electrode that is formed on the dielectric layer.

11. A semiconductor memory device, comprising:
    a semiconductor substrate;
    a first conductive type first impurity region formed on the semiconductor substrate;
    a isolating region formed on the first impurity region, defining the active region of the device;
    a second impurity region formed on a portion of the first impurity region;
    a gate electrode formed on the substrate and isolating region, making contact with a portion of the second impurity region;
    a switching device made of an interlevel insulating layer that exposes the impurity region on the substrate; and
    a capacitor formed on the interlevel insulating layer and impurity region.

12. The device as claimed in claim 11, wherein the semiconductor substrate includes a buried insulating layer.

13. The device as claimed in claim 11, wherein the semiconductor substrate is either a first or a second conductive type.

14. The device as claimed in claim 11, further comprising a third impurity region of the second conductive type around the first impurity region when the semiconductor substrate and the first impurity region are the first conductive type.

15. The device as claimed in claim 11, wherein the first impurity region is used as a bit line.

16. The device as claimed in claim 11, wherein a deep depletion layer is created on the portion which overlaps with the gate electrode of the second impurity region when a turn-on voltage is applied to the gate electrode in order to generate a majority carrier and a minority carrier.

17. The device as claimed in claim 16, wherein a forward bias voltage is applied between the first impurity region and the second impurity region, which is insufficient to turn on the junction, so that the majority carrier flows toward the first impurity region and the minority carrier flows toward the second impurity region.

18. The device as claimed in claim 16, wherein a reverse bias voltage is applied between the first impurity region and the second impurity region, which is insufficient to turn on the junction, so that the majority carrier flows toward the second impurity region and the minority carrier flows to the first impurity region.

* * * * *

UNITED STATES PATENT AND TRADEMARK OFFICE
CERTIFICATE OF CORRECTION

PATENT NO.    : 5,978,259
DATED         : November 2, 1999
INVENTOR(S)   : Son et al.

It is certified that error appears in the above-identified patent and that said Letters Patent is hereby corrected as shown below:

On the title page, in item "[73] Assignee:" please change the name of the assignee from "Semicon Co., Ltd." to -- LG Semicon Co., Ltd. --

Signed and Sealed this

First Day of May, 2001

*Attest:*

NICHOLAS P. GODICI

*Attesting Officer*   Acting Director of the United States Patent and Trademark Office